United States Patent
Bottman et al.

(10) Patent No.: US 8,570,049 B2
(45) Date of Patent: Oct. 29, 2013

(54) METHOD AND APPARATUS FOR MEASURING AC SHIELD CONTINUITY FOR SHIELDED TWISTED PAIR STRUCTURED DATACOMM CABLE LINK

(75) Inventors: Jeffrey Sandsmark Bottman, Seattle, WA (US); Jun Ho Yi, Bothell, WA (US)

(73) Assignee: Fluke Corporation, Everett, WA (US)

( * ) Notice: Subject to any disclaimer, the term of this patent is extended or adjusted under 35 U.S.C. 154(b) by 441 days.

(21) Appl. No.: 12/964,499

(22) Filed: Dec. 9, 2010

(65) Prior Publication Data
US 2012/0146666 A1   Jun. 14, 2012

(51) Int. Cl.
*G01R 27/28*   (2006.01)
*G01R 31/08*   (2006.01)
*H01H 31/02*   (2006.01)

(52) U.S. Cl.
USPC ............... 324/627; 324/527; 324/555

(58) Field of Classification Search
USPC ......... 324/627, 612, 600, 522, 523, 525, 527, 324/555
See application file for complete search history.

(56) References Cited

U.S. PATENT DOCUMENTS

| | | | |
|---|---|---|---|
| 4,647,844 A * | 3/1987 | Biegon et al. | 324/627 |
| 5,677,633 A * | 10/1997 | Moser et al. | 324/539 |
| 6,385,297 B2 * | 5/2002 | Faulkner et al. | 379/1.04 |
| 6,538,450 B2 * | 3/2003 | Bussinger | 324/523 |
| 7,525,319 B1 | 4/2009 | Ahmed et al. | |
| 8,284,904 B2 * | 10/2012 | Crick | 379/22.03 |
| 2004/0100272 A1 | 5/2004 | Styles | |
| 2008/0204034 A1 | 8/2008 | Blades | |
| 2010/0073007 A1 | 3/2010 | Gervais | |
| 2010/0244998 A1 * | 9/2010 | Peyton et al. | 333/24 R |

* cited by examiner

*Primary Examiner* — Hoai-An D Nguyen
(74) *Attorney, Agent, or Firm* — Edwards Wildman Palmer LLP; Scott D. Wofsy; Christopher J. Capelli

(57) ABSTRACT

AC shield continuity for shielded twisted pair structured datacomm cable is determined by testing the cable, driven in a common mode, over a range of frequencies, to determine presence and location of shield breaks. DC ground path generated false results are thereby avoided.

12 Claims, 7 Drawing Sheets

Iteration 1
Theoretical Peak (theo_peak) = 1

Iteration 2
Theorectical Peak (theo_peak) = X1

Iteration 3
Theoretical Peak (theo_peak) = X2

METHOD AND APPARATUS FOR MEASURING AC SHIELD CONTINUITY FOR SHIELDED TWISTED PAIR STRUCTURED DATACOMM CABLE LINK

BACKGROUND OF THE INVENTION

This invention relates to data communications and more particularly to measurement of shield continuity in structured datacomm cable systems.

Structured datacomm cabling systems fall into the two categories of shielded and unshielded. Both employ twisted-pair 100 ohm differential impedance transmission lines for signal transmission. The most common cable type contains (4) twisted pairs within a cable jacket. Unshielded (UTP) cable relies on the intrinsic balance of the twisted pairs to reduce EMI and inter-pair crosstalk to acceptable levels, while shielded cable (STP) also includes metallic shielding to further reduce inter-pair and/or inter-cable emissions and crosstalk. The shielding can be around individual pairs, or around the 4-pair bundle, adjacent to the cable jacket.

For STP cabling, defective shield continuity is an important factor that can seriously degrade emissions performance, consequently causing unacceptable cable to cable crosstalk coupling, and EMI problems. For example, cable to cable crosstalk, commonly known as alien cross talk (AXT) is typically not an issue in well shielded terminated cables, but if there is a shield discontinuity, it can be an issue. AXT is especially troublesome for the 10 Gigabit Ethernet over Twisted Pair application, and is a parameter with specified performance requirements. Shield discontinuities, usually opens, can easily be created at connecting hardware by poor workmanship during the manual process of attaching plugs and jacks to cable stock.

DC Verification of shield continuity is possible by measuring the resistance at one end of a link between the shield and a twisted pair, with a loopback connection between shield and pair at the other end. A low resistance indicates good shield continuity. This method, however, often gives false passing results of faulty links, because the shield is typically connected to earth ground at each end of the link. These earth ground connections provide a 'sneak' path for DC current that bypasses the open link shield, yielding a low resistance value. FIG. 1 illustrates the DC path through ground that causes this false shield continuity passing result.

The twisted pairs in datacomm cabling systems are normally designed to carry differential mode signals, to minimize emissions and crosstalk. Differential mode is characterized by equal and opposite signal voltages on each conductor, relative to shield. However, a shield open cannot be detected by differential mode measurement methods, since no signal current is returned through the shield, which is thus essentially invisible to the measurement.

SUMMARY OF THE INVENTION

In accordance with the invention, a novel method for verifying a previously overlooked aspect of datacomm cabling installation quality is provided.

Accordingly, it is an object of the present disclosure to provide an improved test instrument and method to test for shield discontinuities in cable systems.

It is a further object of the present disclosure to provide an improved apparatus to measure shield discontinuity and avoid DC ground path related false 'good continuity' readings.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION

The system according to a preferred embodiment of the present disclosure comprises a system and method for detecting shield discontinuities in structured datacomm cable systems. TDR measurement techniques are employed, driving the cable system with common mode signaling.

Figure 2:
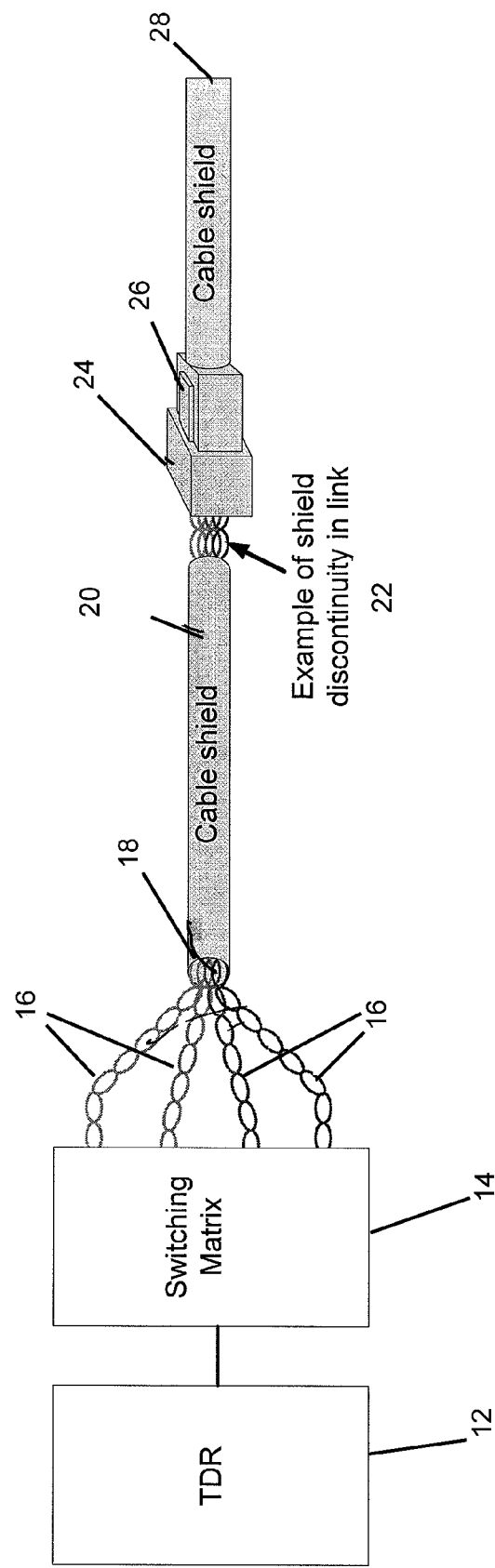
FIG. 2 is an example diagram with a test instrument in accordance with the disclosure attached to a cable system having a shield discontinuity.

Referring to FIG. 2, a block diagram of a system and setup in accordance with the method and apparatus, a time domain reflectometer (TDR) 12 is coupled to a switching matrix 14, the switching matrix interfacing with the 4 twisted pairs 16 of cable 18 (suitably via a connector, not shown). Cable shield 20 has an open circuit discontinuity at 22, the result of a defective installation of connector jack 24. Connector plug 26 and cable 28 are mated with connector jack 24. The TDR block can be either of two types, which are functionally equivalent. The first type generates pulses and applies them to the cable under test. The reflections coming from the incident pulse signal are then digitized and analyzed. The second TDR type generates a sequence of harmonically related sine wave signals and applies them to the cable under test. The magnitude and phase of the reflected sine wave for each frequency is measured. This information is processed using the discrete Fourier transform to yield an equivalent pulse response, which is then analyzed using the methods outlined here.

In operation, the present method and apparatus employ an AC signal generated by TDR 12, applied to cable 18 via switching matrix 14, which drives all 8 conductors of the twisted pairs 16 of cable 18, with return data through the switching matrix to the TDR measured over a range of frequencies, to determine the presence and location of a shield break. A shield break, even with a DC ground 'sneak' path present, is visible via this AC method. This is possible due to the physics governing high frequency signal behavior over transmission lines. The fault location can also be determined, aiding in the troubleshooting and repair process. As noted hereinabove, the twisted pairs in datacomm cabling systems are normally designed to carry differential mode signals, to minimize emissions and crosstalk, but a shield open cannot be detected by differential mode measurement methods, since no signal current is returned through the shield, so the shield open is thus essentially invisible to the measurement. However, in accordance with the present method and apparatus, common mode signaling is used to advantage in shield testing. This mode applies equal voltages on each conductor, relative to shield. In the present method and apparatus, all (4) pairs are driven with the same common mode signal, and the return current is forced to flow through the shield. Thus, a shield break causes signal impairment, which is readily detectable.

Datacomm cable, when driven common mode in this way, behaves somewhat like a conventional coaxial cable, with the 8 wires in the datacomm cable analogous to the coax center conductor. A TDR (time domain reflectometer) trace for a coax cable with open center conductor will contain a large reflection from the open, at a time proportional to fault distance. Similarly, an open-shield datacomm link will show a large reflection at the location of the shield break, with common-mode excitation.

Figure 3:
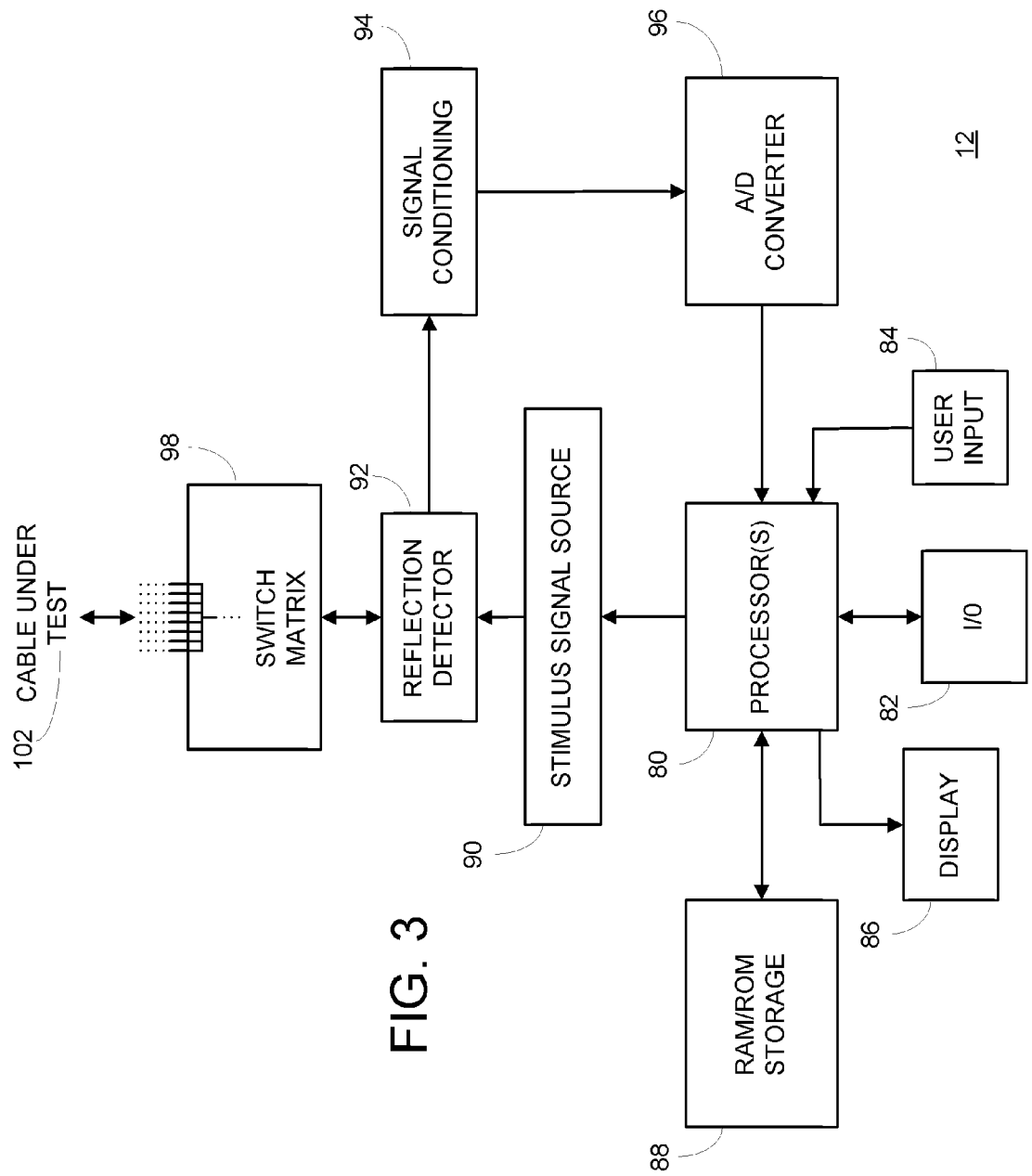
FIG. 3 is a more detailed block diagram of one particular realization of a test instrument in accordance with the disclosure.

FIG. 3 is a more detailed block diagram of TDR 12, wherein a processor (or multiple processors) 80 provide operational functioning for the device, and may include I/O 82 for interface with other instruments or devices, user input devices 84 to accept operational instructions from a user, display 86 for display of results and operational information, memory 88 which may include persistent storage for instructions, test data, and the like.

A stimulus signal source 90 transmits a stimulus signal to the cable under test 102 through the reflection detector 92 and then through the switch matrix 98, which is configured to connect all 8 conductors of the cable together during the test. The resulting reflected signals pass back through the switch matrix 98 and are routed by the reflection detector into signal conditioning circuit 94, then are digitized by A/D convertor 96 for subsequent analysis by processor(s) 80, all the above-noted components implementing a TDR device.

Figure 1:
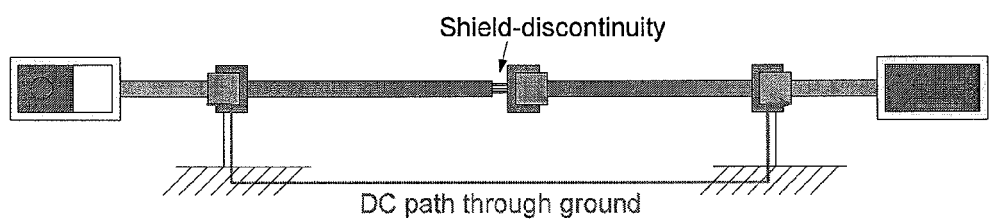
FIG. 1 is a diagram illustrating a cable with shield-discontinuity and DC ground path.
Figure 4:
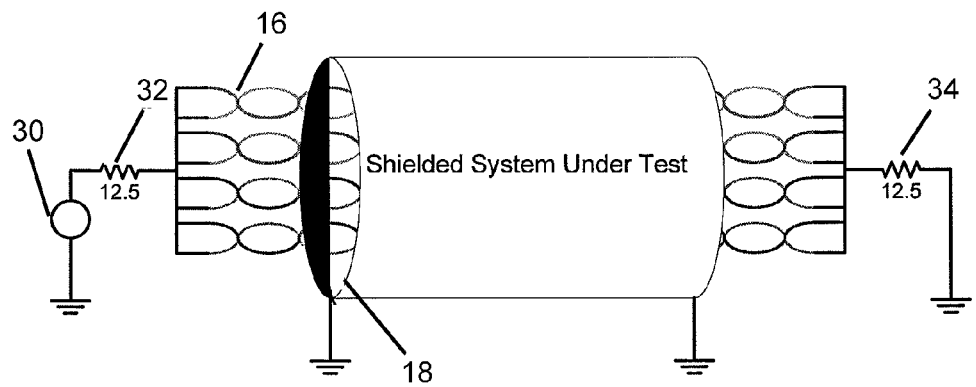
FIG. 4 is a diagram showing the measurement configuration of the present method and apparatus.

FIG. 4 is a diagram illustrating the measurement configuration of the present method and apparatus. The cable system under test 18 has all 8 of the conductors of the 4 pairs 16 excited by a single source 26, with measurement reference impedance 32, 34 of 12.5 ohms.

The signal source 26 suitably comprises a TDR which drives the 8 conductors to determine any shield opens that might be present.

The TDR system employs a detection algorithm in measuring the cable. Since there are many types of shielded cables (e.g. F/UTP, S/FTP, F/FTP), it is impractical to precisely pre-characterize every cable in the field. In order to provide a practical solution in the embodiment of the present method and apparatus, all cables are generalized into two types: F/UTP and X/FTP. Table 1 shows the physical differences between the two generalized types.

TABLE 1

Categorizing shielded cables into two generalized types

| Generalized Types | Outer Shield (over all 4 pairs) | Individual Shield (over each pair) | Example Cables |
|---|---|---|---|
| F/UTP | Foil | None | F/UTP |
| X/FTP | Braid, Foil, None | Foil | S/FTP, F/FTP, FTP |

Each generalized type has its own set of cable parameters ($Z$, $\alpha$, and $\beta$). Therefore, the detection algorithm only requires two sets of cable parameters (F/UTP and X/FTP).

Figure 5:
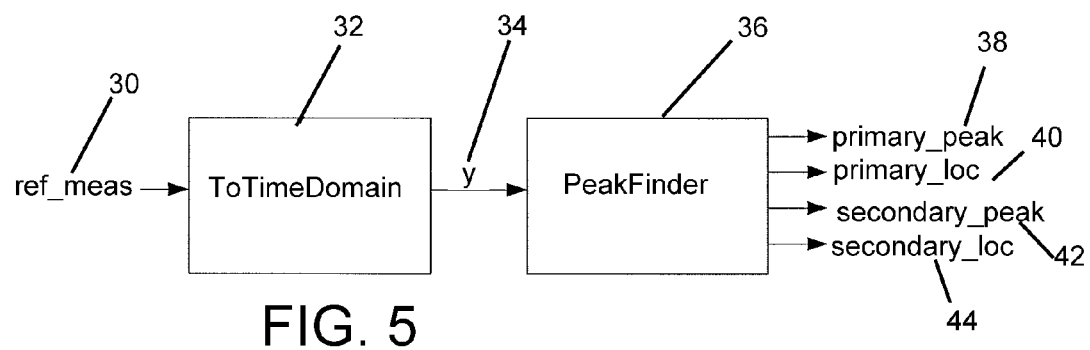
FIG. 5 is a block diagram showing the processing of the TDR measurement.

With reference to FIG. 5, a block diagram illustrating the processing of the TDR measurement, in operation the TDR launches a sequence of harmonically related sine wave signals into the cable which is driven with all 8 wires in common mode, and obtains a measured complex reflection coefficient 30 (ref_meas), which is converted into windowed impulse response time-domain value 34 (Y) by ToTimeDomain block 32. Once the time-domain trace value Y is obtained, a peak finder function 36 is used to find all primary peak values 38 and their time-location 40 and all secondary peak values 42 and their time-location 44 in the TDR trace. Since the algorithm detects up to three connectors, the output arrays, 38, 40, 42, and 43 in FIG. 5, are limited to length of three.

Figure 6:
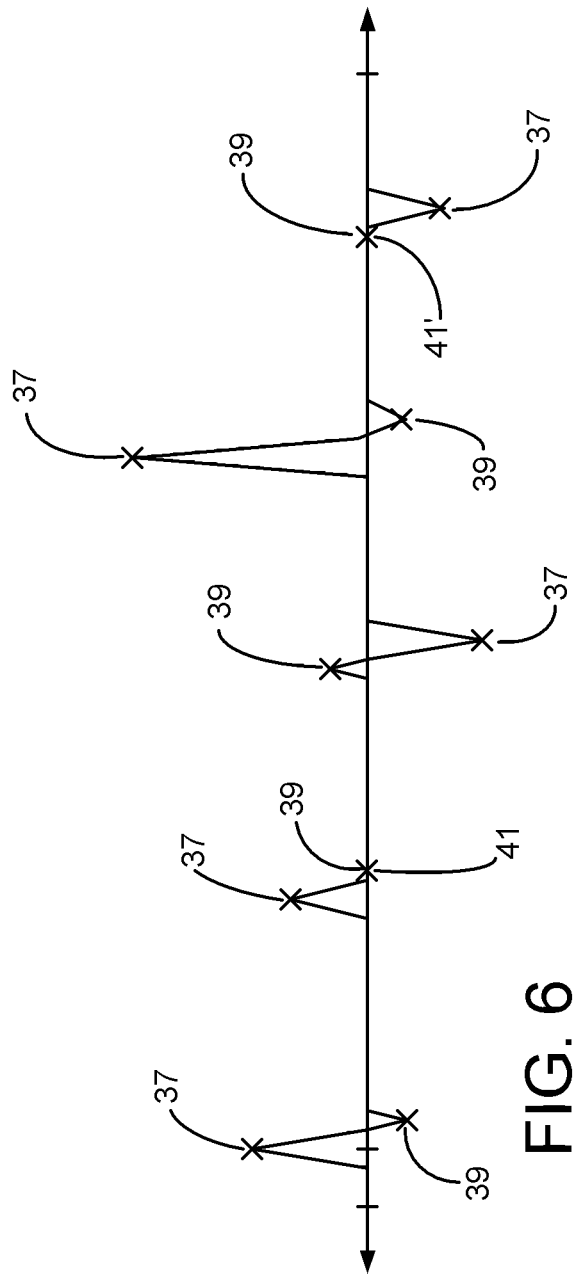
FIG. 6 is a waveform diagram for illustrating primary and second peak value finding.

FIG. 6 is a waveform diagram to assist in illustrating primary and second peak value finding wherein peak pairs in TDR traces are located by the peak finder function 36. The function returns locations and amplitudes of primary and secondary peaks (up to three are returned in a particular embodiment). Primary peaks 37 can be either positive or negative, and each primary peak is paired-up with a secondary peak 39 (peaks marked with "x" in FIG. 6). The absolute value of positive peak is always greater than that of its associated secondary peak. If primary peak is positive, its associated secondary peak is negative or zero, and the secondary peak follows the primary peak. On the other hand, if the primary peak is negative, its associated secondary peak is positive or zero, and the secondary peak leads the primary peak. The secondary peaks are set to zero (for example the $2^{nd}$ and $5^{th}$ pair of peaks at 41, 41' in FIG. 6) if there is no apparent peak that follows or leads the primary peak. Once all primary and secondary peaks are identified, the function only retains the first three pairs (in a particular embodiment) to output.

Figure 7:
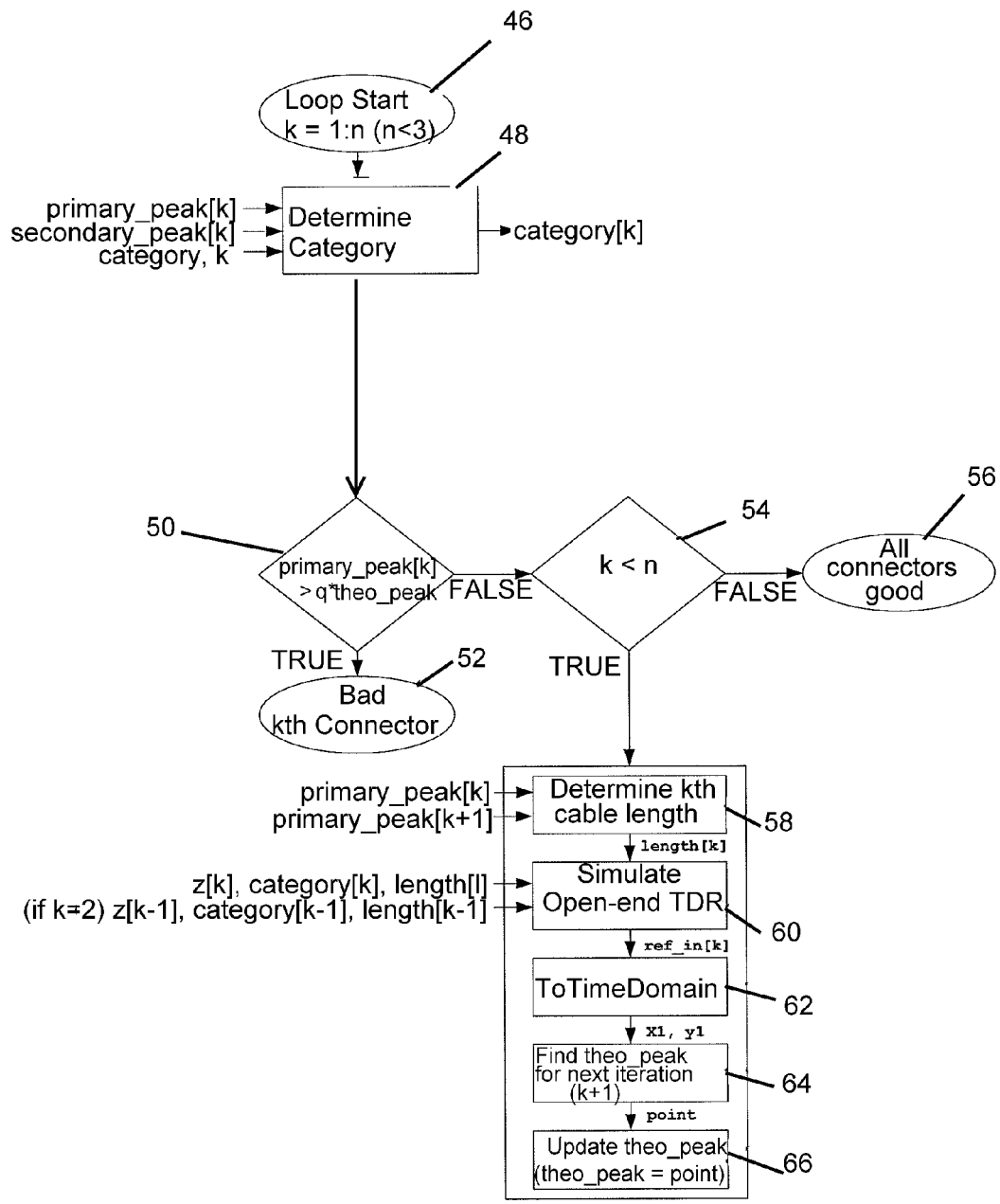
FIG. 7 is a flow chart showing the process of making determination of shield discontinuity.

Referring now to FIG. 7, a flow chart of the processing, at loop start 46, loop counter k is initialized (to value 1), and the previously determined primary and secondary peak values are supplied to a determine cable type process 48. For the first iteration through the loop, the polarity of the sum of the primary and secondary peak values determines the category (e.g. type of cable, X/FTP or F/UTP in the particular embodiment). If polarity is positive, the cable is X/FTP, if negative, F/UTP. Calculation parameters (characteristic impedance, q, nominal velocity of propagation) are set for later use based on cable type (for example, a value q for F/UTP cable is 0.6, while q for X/FTP cable is 0.8).

Next, in decision block 50, it is determined whether the primary peak value is greater than q times the theoretical peak value. The theoretical peak value is a representation of the value of an open reflection peak would be for the given connector k. If greater, then the connector number k is 'bad' and the test is complete and the existence of this bad connector (i.e, a shield discontinuity) is reported at block 52. The location of the bad connector can also be reported. The test can then stop as a bad connector was located.

If the primary peak value is not greater than q times the theoretical peak value, then the connector is presumed to be 'good' and processing continues to decision block 54, which determines whether the desired number of cable segments have been tested. In a particular embodiment, 2 cable segments are tested which would represent 3 connectors (the connector attaching cable segment 1 to the test instrument, the connector attaching cable segment 1 to cable segment 2, and the connector at the end of cable segment 2.

If the desired number of connectors/cable segments have been tested (in this case, if k is not less than 3) then the process is complete at block 56 and a status of 'no shield discontinuity detected' is reported.

If the process is not yet completed (k is less than 3 at block 54) then at block 58 the length of the current cable segment is determined, a simulation is made of the values that a TDR would return if the end of the cable segment was open (block 60), the returned value is converted to time domain (block 62). The theoretical peak value for the next iteration is obtained from pre-stored values for typical cables, and the theoretical peak value theo_peak is updated for use in the next iteration (block 66).

The process loop continues at block 48, k having been incremented, continuing until either a bad connector is determined at block 50 or k is no longer less than the number of desired iterations n (n is 3 in the illustrated embodiment).

Figure 8:
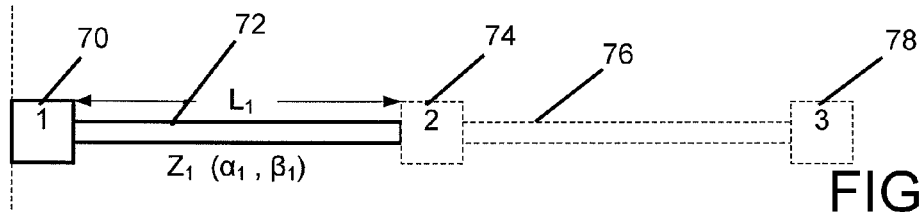
FIGS. 8, 9 and 10 are diagrams illustrating exemplary cases of 3 iterations through the testing loop.

Referring now to FIG. 8, a diagram illustrating an exemplary cases of a first iteration through the testing loop in the case of a cable system having 3 connections and 2 cables, the first connector 70 has cable segment 72 attached thereto, with connection 74 at the end of cable segment 72 providing the interconnection of cable segment 72 and cable segment 76. The distal end of cable segment 76 has connector 78 thereon.

In beginning the testing, connector 70 attaches the cable system to the test instrument (not shown in FIG. 8). The device and method accomplishes the following:

1. Determine the state of the first connector 70 (connector 1), which in the illustrated example would be the connector on the end of a cable that is connected to the test instrument. If the first connector is bad, detection is finished and a report of bad is returned at block 50 in the flow chart of FIG. 6. The determination is made by comparing the measured value of the primary peak against the theoretical peak value times k (theo_peak*k) where k=0.8 for X/FTP and k=0.6 for F/UTP cables. The cable segment is determined to possess shield discontinuity if the measured values is larger than the theoretical peak value times k. Theoretical peaks are determined during each iteration from three pre-determined parameters: length (L1 or L2), cable impedance (Z1 or Z2) in FIGS. 8, 9 and 10. The well known telegrapher's equations are used to determine the theoretical peak.

2. Find the cable length L1 and impedance Z1. Z1 is determined by looking up the pre-determined impedance values for X/FTP (8.44 ohms) and F/UTP (15.85 ohms). L1 is determined by subtracting the second primary peak time-location value (40 in FIG. 5) from the first primary peak time-location (40 in FIG. 5), and multiplying by pre-determined propagation velocity for given cable type.

3. Simulate a theoretical open-reflection at the second connector 74 by using L1, Z1, and well known technique of determining open reflection of transmission line.

4. Replace the theoretical peak value theo_peak with theoretical open-reflection height (X1).

Figure 9:
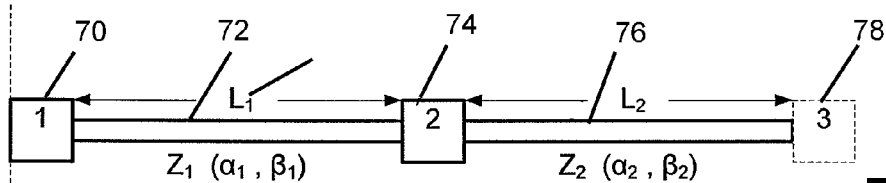

Referring now to FIG. 9, which would be relevant in the case where the first connector 70 was not a bad connection above, the following steps are taken:

1. Determine the state of the second connector 74 (connector 2), which in the illustrated example is connecting cable segments 72 and 76. The connector is determined to posses shield discontinuity if the measured value of the primary peak is larger than the theoretical peak value times k. If this second connector is bad, detection is finished and a report of bad is returned at decision block 50 in the flow chart of FIG. 6 and the process is complete. The determination is made by comparing the measured value of against the theoretical peak value times k (theo_peak*k) where k=0.8 for X/FTP and k=0.6 for F/UTP cables. The cable segment is determined to posses shield discontinuity if the measured values is larger than the theoretical peak value times k.

2. Next, as before, if the state of connector 74 is that it did not have a bad connection, find the cable length L2 and Z2. Z2 is determined by looking up the pre-determined impedance values for X/FTP (8.44 ohms) and F/UTP (15.85 ohms). L2 is determined by subtracting the third primary peak time-location value (40 in FIG. 5) from the second primary peak time-location (44 in FIG. 5), and multiplying by pre-determined propagation velocity for given cable type.

3. Simulate a theoretical open-reflection at the third connector 78 by using L2, Z2, and well known technique of determining open reflection of transmission line.

4. Replace the theoretical peak value theo_peak with theoretical open-reflection height (X1).

Figure 10:
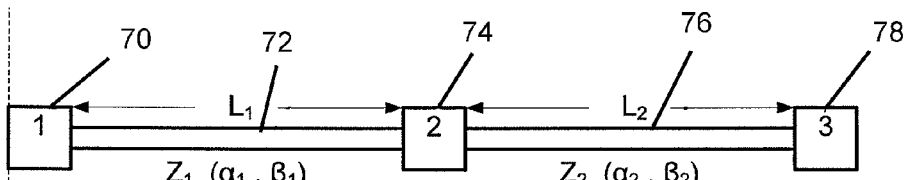

Referring now to FIG. 10, which would be relevant in the case where the second connector 74 was not a bad connection above, the following step is taken:

1. Determine the state of the third connector 78 (connector 3), which in the illustrated example is the connector at the far end of cable segment 76 from the test instrument and the connector 74. The determination is made by comparing the measured value of the primary peak against the theoretical peak value times k (theo_peak*k) where k=0.8 for X/FTP and k=0.6 for F/UTP cables. The connector is determined to posses shield discontinuity if the measured values is larger than the theoretical peak value times k. If this third connector is bad, detection is finished and a report of bad is returned at decision block 50 in the flow chart of FIG. 7 and the process is complete. Otherwise, the determination is complete since the example case of checking 3 connector segments has been performed.

In accordance with the above, a device and method for making AC shield continuity measurements on shielded twisted pair cabling is provided, enabling detection of defective shield continuity which might otherwise degrade emissions performance, and resulting in unacceptable cable to cable crosstalk coupling, and EMI issues. The device and method enable detection of shield discontinuities, avoiding false passing results of faulty links that might be caused by ground connection 'sneak' paths for DC current in accordance with prior art measurement methods and devices.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

What is claimed is:

1. A method for measuring ac shield continuity for shielded twisted pair structured datacomm cable having plural twisted pairs, comprising:
applying a test signal in common mode to plural ones of said twisted pairs;
measuring response to said applying step to determine shield continuity;
finding primary peak values and their time-location and secondary peak values and their time-location in the converted time-domain value; and
determining whether the primary peak values are greater than a value q times a theoretical peak value; if the primary peak values are greater than q times the theoretical peak values, determining a continuity problem exists for a cable segment.

2. The method according to claim 1, wherein said applying a test signal comprises applying said test signal substantially simultaneously to said plural ones of said twisted pairs.

3. The method according to claim 1, wherein said applying a test signal comprises applying test signals at multiple frequencies.

4. The method according to claim 1, wherein said applying and measuring comprises performing TDR testing.

5. A method of testing for shield continuity in shielded cabling having plural twisted pairs, comprising:
   launching a TDR test signal into the cabling driven in common mode;
   obtaining a measured complex reflection coefficient from the cabling;
   converting the measured complex reflection coefficient into a time-domain value;
   finding primary peak values and their time-location and secondary peak values and their time-location in the converted time-domain value;
   determining whether the primary peak values are greater than a value q times a theoretical peak value; if the primary peak values are greater than q times the theoretical peak values, determining a continuity problem exists for a cable segment.

6. The method according to claim 5, further comprising, if the primary peak values are not greater than q times the theoretical peak values, determining a connector continuity problem does not exist for the cable segment.

7. The method according to claim 6, further comprising, determining whether a desired number of cable segments have been tested, and if so, reporting a status of no shield discontinuity detected.

8. The method according to claim 6, further comprising, determining whether a desired number of cable segments have been tested, and if not, determining a length of a current cable segment, simulating values that a TDR would return if the end of the cable segment was open, and determining a theoretical peak value for a next iteration of measuring shield continuity.

9. A shield continuity testing device for testing shield continuity in shielded cabling having plural twisted pairs, comprising:
   a TDR test signal generator for providing test signals into the cabling driven in common mode;
   a TDR receiver for obtaining a measured complex reflection coefficient from the cabling in response to the test signals from the generator;
   a processor operative for converting the measured complex reflection coefficient into a time-domain value, finding primary peak values and their time-location and secondary peak values and their time-location in the converted time-domain value, determining whether the primary peak values are greater than a value q times a theoretical peak value, and if the primary peak values are greater than q times the theoretical peak values, determining a continuity problem exists for a cable segment.

10. The shield continuity testing device according to claim 9, wherein said processor further determines, if the primary peak values are not greater than q times the theoretical peak values, that a connector continuity problem does not exist for the cable segment.

11. The shield continuity testing device according to claim 10, wherein said processor determines whether a desired number of cable segments have been tested, and if so, reports a status of no shield discontinuity detected.

12. The shield continuity testing device according to claim 10, wherein said processor further determines whether a desired number of cable segments have been tested, and if not, determines a length of a current cable segment, simulates values that a TDR would return if the end of the cable segment was open, and determines a theoretical peak value for a next iteration of measuring shield continuity.

* * * * *